(12) United States Patent
Chadha et al.

(10) Patent No.: US 10,593,928 B2
(45) Date of Patent: Mar. 17, 2020

(54) SINGLE-STEP SYNTHESIS OF NANOSTRUCTURED THIN FILMS BY A CHEMICAL VAPOR AND AEROSOL DEPOSITION PROCESS

(71) Applicant: Washington University, St. Louis, MO (US)

(72) Inventors: Tandeep Singh Chadha, St. Louis, MO (US); Pratim Biswas, St. Louis, MO (US); Woo-Jin An, St. Louis, MO (US)

(73) Assignee: Washington University, St. Louis, MO (US)

( * ) Notice: Subject to any disclaimer, the term of this patent is extended or adjusted under 35 U.S.C. 154(b) by 137 days.

(21) Appl. No.: 14/830,361

(22) Filed: Aug. 19, 2015

(65) Prior Publication Data

US 2016/0056448 A1 Feb. 25, 2016

Related U.S. Application Data

(60) Provisional application No. 62/039,736, filed on Aug. 20, 2014.

(51) Int. Cl.
*H01M 4/04* (2006.01)
*C01G 19/02* (2006.01)
(Continued)

(52) U.S. Cl.
CPC ............ *H01M 4/0428* (2013.01); *C01G 1/02* (2013.01); *C01G 19/02* (2013.01); *C01G 23/07* (2013.01); *C23C 16/405* (2013.01); *C23C 16/4551* (2013.01); *H01M 4/1391* (2013.01); *C01P 2002/04* (2013.01); *C01P 2002/54* (2013.01); *C01P 2002/72* (2013.01); *C01P 2002/85* (2013.01); *C01P 2004/03* (2013.01); *C01P 2004/16* (2013.01); *C01P 2006/40* (2013.01); *H01M 4/485* (2013.01); *H01M 10/054* (2013.01); *H01M 10/0525* (2013.01)

(58) Field of Classification Search
CPC ..... B82Y 30/00; C01G 25/02; H01B 13/0036
USPC ........ 585/733; 430/270.1; 428/702; 429/188
See application file for complete search history.

(56) References Cited

U.S. PATENT DOCUMENTS 5,278,138 A 1/1994 Ott et al.
2010/0307593 A1 12/2010 Thimsen et al.
(Continued)

FOREIGN PATENT DOCUMENTS

WO 2009032654 A1 3/2009

OTHER PUBLICATIONS

An et al., "Aerosol-Chemical Vapor Deposition Method for Synthesis of Nanostructured Metal Oxide Thin Films With Controlled Morphology," The Journal of Physical Chemistry Letters 21, 2010, pp. 249-253.
(Continued)

*Primary Examiner* — Khanh T Nguyen
(74) *Attorney, Agent, or Firm* — Armstrong Teasdale LLP

(57) ABSTRACT

The present disclosure is generally directed to a single-step synthesis of nanostructured thin films by a chemical vapor and aerosol deposition (CVAD) process. The present disclosure is also directed to methods for controlling the morphology of the nanostructured thin films. The films can be used, for example, in lithium ion and/or sodium ion battery electrodes, solar cells and gas sensors.

20 Claims, 13 Drawing Sheets

(51) Int. Cl.
*C23C 16/455* (2006.01)
*C01G 1/02* (2006.01)
*C23C 16/40* (2006.01)
*C01G 23/07* (2006.01)
*H01M 4/1391* (2010.01)
*H01M 10/0525* (2010.01)
*H01M 10/054* (2010.01)
*H01M 4/485* (2010.01)

(56) References Cited

U.S. PATENT DOCUMENTS

| 2012/0172648 A1* | 7/2012 | Seebauer | B82Y 30/00 585/733 |
| 2013/0084672 A1 | 4/2013 | Keszler et al. | |
| 2013/0295507 A1* | 11/2013 | Keszler | C01G 25/02 430/270.1 |
| 2014/0037988 A1* | 2/2014 | Ganjoo | H01B 13/0036 428/702 |
| 2014/0248531 A1* | 9/2014 | Tan | B82Y 30/00 429/188 |

OTHER PUBLICATIONS

An et al. "Thermal conduction effects impacting morphology during synthesis of columnar nanostructured TiO2 thin films." Journal of Materials Chemistry 1, 2011, pp. 7913-7921.

Dekker et al., "Particle-Precipitation-Aided Chemical Vapor Deposition of Titanium Nitride," Journal of American Ceramic Society, 1997, vol. 80, No. 3, pp. 629-636.

Thimsen et al., "Nanostructured Photoactive Films Synthesized by a Flame Aerosol Reactor", AICHE Journal, Jul. 2007, vol. 53, No. 7, pp. 1727-1735.

* cited by examiner

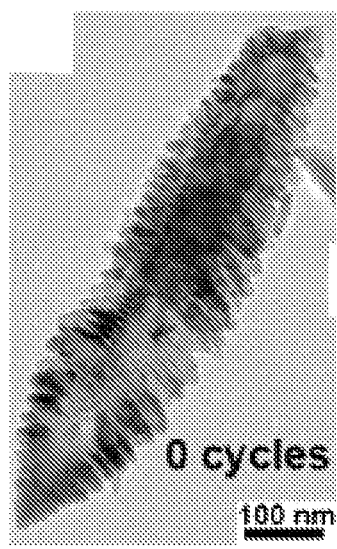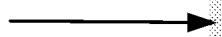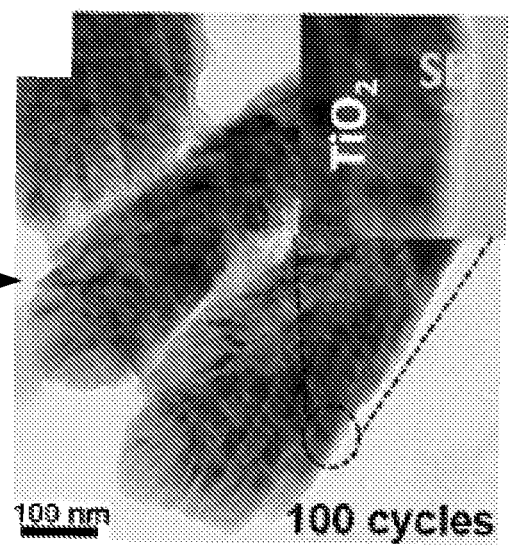
FIG. 4B          FIG. 4C

SINGLE-STEP SYNTHESIS OF NANOSTRUCTURED THIN FILMS BY A CHEMICAL VAPOR AND AEROSOL DEPOSITION PROCESS

CROSS-REFERENCE TO RELATED APPLICATION

This application claims priority to U.S. Provisional Application Ser. No. 62/039,736, filed Aug. 20, 2014, which is incorporated herein in its entirety.

FIELD OF THE DISCLOSURE

The present disclosure is generally directed to a single-step synthesis of nanostructured thin films by a chemical vapor and aerosol deposition (CVAD) process. The present disclosure is also directed to methods for controlling the morphology of the nanostructured thin films. The films can be used, for example, in lithium ion and/or sodium ion battery electrodes, solar cells and gas sensors.

BACKGROUND OF THE DISCLOSURE

Various metal oxides, such as titanium dioxide, have emerged as attractive materials for nanostructured thin films. These films may be used, for example, as anodes in lithium ion batteries in electric vehicles and hybrid electric vehicles due to their advantages of minimal volume expansion upon lithium intercalation and an operating voltage that allows for superior safety and superior performance over conventional anodes. Some of these oxides, however, have shortcomings that include poor electrical conductivity as a result of the semiconductor nature of the material and low mobility of metal ions in the crystal structure, both of which lead to a poor rate capability. Theoretical bulk capacity is also limited in conventional anodes.

The poor electrical conductivity has often been addressed through the addition of carbon based conductive additives and/or graphene, while other shortcomings have been addressed by nanostructuring the electrode in the form of nanoparticles, nanorods, nanotubes, nanosheets and nanodisks. This provides for a reduced path for metal ion diffusion and a higher surface area at the electrolyte/electrode interface, which provides surface storage of the metal ions. The utilization of the advantages of nanostructuring, however, are very limited in current systems due to the conventional electrode fabrication process.

Conventional processes include a two-step process involving the synthesis of active material followed by doctor blading the active material along with an additive and an electrically insulating binding agent onto a current collector. This limits the ability to make electrodes with oriented structures and leads to aggregation of the nanostructures during electrode preparation or cycling. Further, the presence of the non-active binder and conducting additive decreases the specific capacity of the battery.

There remains a need, therefore, to resolve the drawbacks associated with current techniques while achieving benefits that allow for the highest specific capacity for the active materials in, for example, an electrode.

SUMMARY OF THE DISCLOSURE

In one aspect of the present disclosure, a chemical vapor and aerosol deposition process for the preparation of a metal species-based nanostructured film is disclosed. The process comprises introducing at least one vaporized metal precursor into a reaction chamber; decomposing, at least in part, the at least one vaporized precursor to form metal species-based nanoparticles; depositing the nanoparticles and any remaining vaporized precursor onto a temperature controlled substrate; and, sintering the nanoparticles to form the metal species-based nanostructured film.

In another aspect of the present disclosure, a metal species-based nanostructured film is disclosed. The film comprises nanoparticles and has a single crystal dendritic nanostructure.

In yet another aspect of the present disclosure, a chemical vapor and aerosol deposition process for the production of an ion battery electrode is disclosed. The process comprises introducing at least one vaporized metal precursor into a reaction chamber; decomposing, at least in part, the at least one vaporized precursor to form metal species-based nanoparticles; directly depositing the nanoparticles and any remaining vaporized precursor onto a temperature controlled substrate to form the electrode; and, sintering the nanoparticles to form the metal species-based nanostructured electrode.

BRIEF DESCRIPTION OF THE DRAWINGS

FIG. 4B is an exemplary embodiment of an HR-TEM image of the columnar nanostructures before cycling in accordance with the present disclosure. FIG. 4C is an exemplary embodiment of an HR-TEM image of the columnar nanostructure in accordance with the present disclosure after 100 cycles at a 1 C rate.

DETAILED DESCRIPTION OF CERTAIN EMBODIMENTS

Figure 1A:
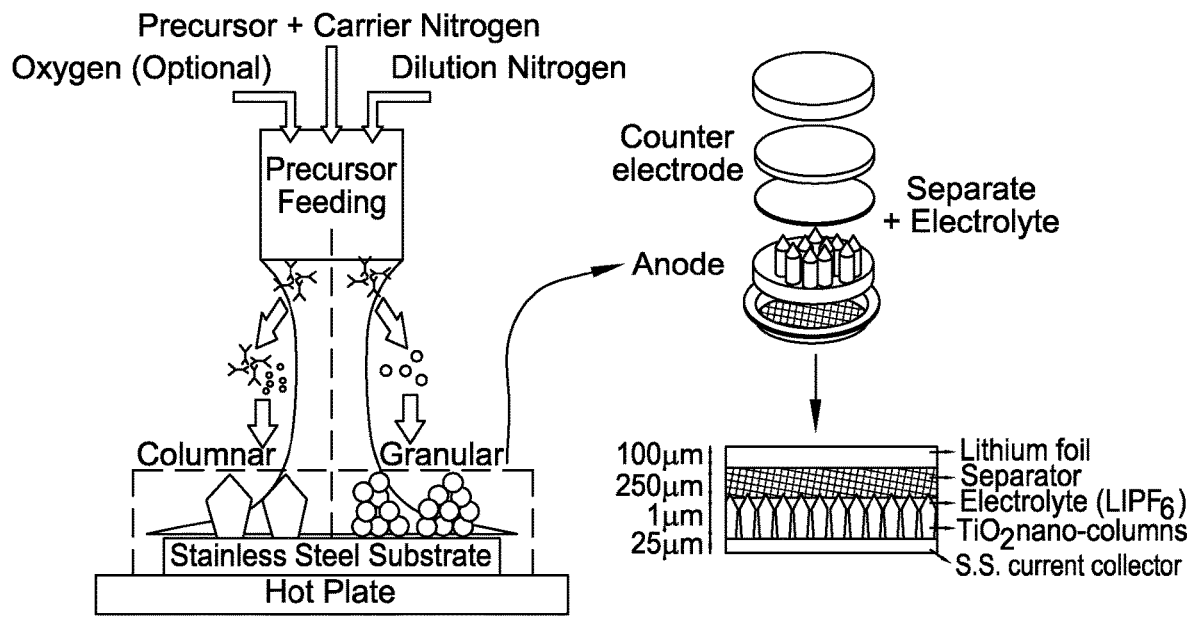
FIG. 1A is an exemplary embodiment of an overview of the nanostructure fabrication by the CVAD process in accordance with the present disclosure where $TiO_2$ nanostructures are synthesized directly on a stainless steel current collector.
Figure 1B:
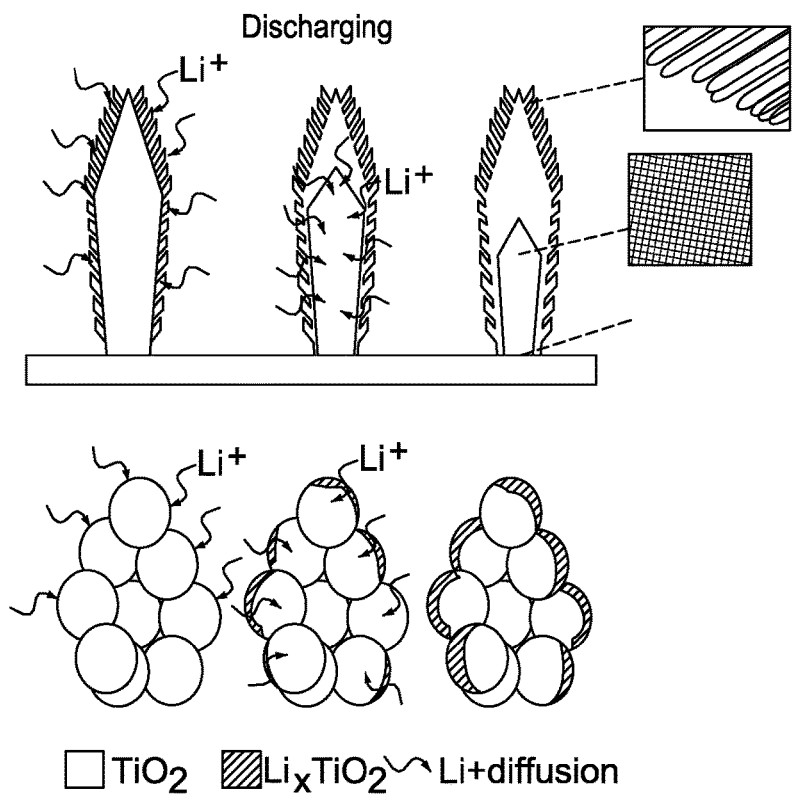
FIG. 1B is an exemplary embodiment of a dendritic columnar structure compared to a granular structure in accordance with the present disclosure.

The present disclosure is directed to a single-step synthesis of nanostructured thin films by a chemical vapor and aerosol deposition (CVAD) process. The present disclosure provides for high quality nanostructured thin films that can be used, for example, in lithium ion and/or sodium ion battery electrodes, solar cells and gas sensors.

In one embodiment of the present disclosure, a CVAD process for the preparation of a metal species-based nanostructured film is disclosed. The process comprises introducing at least one vaporized metal precursor into a reaction chamber, decomposing, at least in part, the at least one vaporized precursor to form metal species-based nanoparticles, depositing the nanoparticles and any remaining vaporized precursor onto a temperature controlled substrate; and, sintering the nanoparticles to form the metal species-based nanostructured film.

The at least one metal precursor can be any metal compound that can be volatilized and oxidized, nitrided, hydrolyzed, or otherwise reacted in a high temperature environment. The precursor can also be a gas, such as, for example, silane ($SiH_4$). Examples of volatile metal compounds include metal alkyls, metal olefin complexes, metal hydrides, metal halides, metal alkoxides, metal oxides, metal formates, acetates, oxalates, and esters generally, metal glycolates, metal glycolato alkoxides, complexes of metals with hydroxyalkyl amines, etc. Examples of typical metal precursors include, for example, titanium isopropoxide ("TTIP"), niobium ethoxide, aluminum tri-secbutoxide (ATSB), tetramethyl tin (TMT), 2,2,6,6-tetramethyl-3,5-heptanedionato lithium [Li (TMHD)], lithium dipivaloylmethanate [Li(DPM)], lithium acetylacetonate, ferrocene and iron pentacarbonyl. All such compounds useful in the present process are termed "metal precursors." Volatile metal compounds are defined as solid or liquid compounds capable of passing into the vapor state at a temperature within the scope of the present disclosure.

In some embodiments, the volatile metal compounds are heated and passed into a carrier gas stream for delivery to the reaction chamber. The carrier gas can be an inert gas, a fuel gas, an oxidizer gas or combinations thereof. Heat can be supplied to the volatile metal compounds indirectly such as by heating the container in which it is stored or by heating a recirculating slip stream, or directly such as by heating the carrier gas and passing it over or bubbling it through the volatile metal compound.

In some embodiments of the present disclosure, the at least one precursor is selected from the group consisting of titanium tetraisopropoxide (TTIP), niobium ethoxide, aluminum tri-secbutoxide (ATSB), tetramethyl tin (TMT), 2,2,6,6-tetramethyl-3,5-heptanedionato lithium [Li (TMHD)], lithium dipivaloylmethanate [Li(DPM)], lithium acetylacetonate and combinations thereof. In other embodiments of the present disclosure, two or more precursors are introduced into the reaction chamber. In some embodiments, two metal precursors are introduced into the reaction chamber and comprise titanium tetraisopropoxide and 2,2,6,6-tetramethyl-3,5-heptanedionato lithium. In some embodiments, two metal precursors are introduced into the reaction chamber and comprise niobium ethoxide and TTIP.

The metals used in the present disclosure can comprise metals, and combinations thereof, from groups III-V of the periodic table of elements, the transition metals and the inner transition metals (i.e., lanthanides and actinides). "Metals," as used herein, include those commonly referred to as semi-metals, including but not limited to boron, germanium, silicon, arsenic, tellurium, etc. Metals of Groups I and II may also be used, generally in conjunction with a further metal from one of the aforementioned groups. Non-metal compounds such as those of phosphorous may also be used when a metal is used, e.g. to prepare mixed oxides or as dopants. In many cases, a predominant metal compound such as a tin or silicon compound is used, in conjunction with less than about 10 mol percent of another metal, such as a transition or inner-transition metal, to provide doped particles with unusual optical, magnetic, or electrical properties. Some preferred metals include silicon, titanium, niobium, zirconium, aluminum, gold, silver, platinum and tin.

The metal species-based nanoparticles generated during the CVAD process from the precursors may be a zero valent metal, an oxide or hydroxide thereof, a carbide, boride, phosphide, nitride or other species, or mixtures thereof. Preferred metal species are zero valent metals, metal oxides, or metal nitrides, more preferably zero valent metals and/or metal oxides.

In some embodiments of the present disclosure, the metal species-based nanoparticles comprise a metal oxide selected from the group consisting of lithium titanate ($Li_4Ti_5O_{12}$), aluminum titanate ($Al_2TiO_5$), titanium dioxide ($TiO_2$), tin oxide ($SnO_2$), lithium manganese oxide, lithium cobalt oxide, lithium manganese nickel cobalt oxide, nickel oxide, copper oxide, lithium manganese nickel oxide ($LiMn_xNi_yO$), silicon and combinations thereof. In other embodiments, the metal oxide is lithium titanate. In some embodiments, these metal oxides are in the anatase, rutile, or brookite phases.

Other metal compounds useful in accordance with the present disclosure include, but are not limited to, anatase, rutile or amorphous forms of metal oxides such as zinc oxide (ZnO), tungsten trioxide ($WO_3$), ruthenium dioxide ($RuO_2$), silicon oxide (SiO), silicon dioxide ($SiO_2$), iridium dioxide ($IrO_2$), strontium titanate ($SrTiO_3$), barium titanate ($BaTiO_3$), tantalum oxide ($Ta_2O_5$), calcium titanate ($CaTiO_3$), iron (III) oxide ($Fe_2O_3$), molybdenum trioxide ($MoO_3$), niobium pentoxide ($NbO_5$), indium trioxide ($In_2O_3$), cadmium oxide (CdO), hafnium oxide ($HfO_2$), zirconium oxide ($ZrO_2$), manganese dioxide ($MnO_2$), copper oxide ($Cu_2O$), vanadium pentoxide ($V_2O_5$), chromium trioxide ($CrO_3$), yttrium trioxide ($YO_3$), silver oxide ($Ag_2O$), or $Ti_xZr_{1-x}O_2$ wherein x is between 0 and 1; metal sulfides such as cadmium sulfide (CdS), zinc sulfide (ZnS), indium sulfide ($In_2S_3$), copper sulfide ($Cu_2S$), tungsten disulfide ($WS_2$), bismuth trisulfide ($BiS_3$), or zinc cadmium disulfide ($ZnCdS_2$); metal chalcogenites such as zinc selenide (ZnSe), cadmium selenide (CdSe), indium selenide (In$_2$Se$_3$), tungsten selenide (WSe$_3$), or cadmium telluride (CdTe); metal nitrides such as silicon nitride (SiN, Si$_3$N$_4$) and gallium nitride (GaN); metal phosphides such as indium phosphide (InP); metal arsenides such as gallium arsenide (GaAs); semiconductors such as silicon (Si), silicon carbide (SiC), diamond, germanium (Ge), germanium dioxide (GeO$_2$) and germanium telluride (GeTe); photoactive homopolyanions such as W$_{10}$O$_{32}^{-4}$; photoactive heteropolyions such as XM$_{12}$O$_{40}^{-n}$ or X$_2$M$_{18}$O$_{62}^{-7}$ wherein x is Bi, Si, Ge, P or As, M is Mo or W, and n is an integer from 1 to 12; polymeric semiconductors such as polyacetylene; and mixtures thereof.

In some embodiments, the nanostructured film has a thickness of from about 10 nanometers to about 1 millimeter, preferably from about 10 nanometers to about 50 micrometers.

In some embodiments of the present disclosure, the nanoparticles have an average particle size of less than about 100 nanometers, in other embodiments less than about 50 nanometers, in other embodiments less than about 20 nanometers. The size of the nanoparticles can refer to the size of the particles during the decomposition phase and/or the size of the particles as they deposit onto the temperature controlled substrate.

When the metal precursor is introduced into the reaction chamber, the precursor is in a gaseous (e.g., vaporized) form. Once the precursor(s) enters the reaction chamber, the precursor(s) transitions from the gas phase to a solid phase, in the form of the nanoparticles. Thus, while the decomposition step is occurring, the precursor will, at least in part, decompose to form metal species-based nanoparticles. In some embodiments, the precursor will completely decompose into nanoparticles, while in other embodiments, the precursor will only partially decompose into nanoparticles. In the instances that the precursor only partially decomposes into nanoparticles, any remaining gaseous phase vaporized precursor may also decompose and deposit onto the temperature controlled substrate via surface reaction.

The temperature controlled substrate of the present disclosure can also be referred to as the "current collector" or "support." In general, the substrate can be any material that will not melt and will maintain structural integrity at the metal species-based nanoparticle deposition temperature used in the process. Suitable substrates include, without limitation, silica fibers, silicon, quartz, stainless steel, steel, glass, aluminum, ceramic and ceramic fibers. The substrates can be optionally coated prior to metal species deposition. In preferred embodiments, the substrate comprises a material selected from the group consisting of stainless steel, silicon, glass and electrically conducting layer coated glass.

The temperature of the substrate can affect a variety of elements, including the sintering rate of the nanoparticles. For example, at low temperatures, granular films can be formed due to the low sintering rate amongst the deposited particles. At higher substrate temperatures, sintered columnar films can be obtained. At very high temperatures, the films can anneal out resulting in the collapse of formed columnar structures. Substrate temperature can be controlled by various means, such as, for example, by using heaters in contact with a heated plate on which the substrate is placed. A thermocouple can also be used to monitor the temperature at or near the substrate surface. The thermocouple can be integrated with a feedback control to control the power supplied to the heater, to form a temperature control loop for the maintenance of substrate temperature at a preselected setpoint. In yet other embodiments, one or more thermal resistance devices can be inserted between the substrate surface and heated plate. Selection of a thermal resistance device can depend on the desired substrate surface temperature. Exemplary devices include heat-treated glass, stainless steel and aluminum.

Depending upon the identity of the metal species-based nanoparticles deposited on the substrate and the desired morphology, the substrate temperature can be controlled in the range of from about 20° C. to about 1000° C., or from about 20° C. to about 350° C.; for example, about 20° C., 50° C., 100° C., 150° C., 200° C., 250° C., 300° C., 350° C., 400° C., 450° C., 500° C., 550° C., 650° C., 700° C., 750° C., 800° C., 850° C., 900° C., 950° C. or even about 1000° C.

In some embodiments of the present disclosure, the CVAD process allows for controlling the morphology of the nanostructured films produced. In some embodiments, the morphology of the nanostructured film is controlled by at least one of adjusting the precursor temperature, adjusting the residence time of the particles in the reaction chamber, adjusting a deposition particle size of the nanoparticles, adjusting an arrival rate of the nanoparticles, and adjusting a sintering rate of the nanoparticles.

In some embodiments, the nanostructure is of a morphology selected from the group consisting of a predominantly columnar morphology, a predominantly granular morphology, a predominantly smooth morphology, a predominantly nanorod morphology, a predominantly nanowire morphology, and a predominantly branched morphology. In a preferred embodiment, the nanostructure is of a predominantly columnar morphology. In yet other embodiments, the columnar morphology has a crystalline order of from about 1 nanometer to about 5 micrometers.

In accordance with one aspect of the present disclosure, a metal species-based nanostructured film is disclosed. The film comprises a columnar morphology, wherein the columnar morphology comprises single crystal dendritic nanocolumns. The columnar morphology can have a crystalline order of from about 1 nanometer to about 5 micrometers.

Columnar morphology can be defined by two criteria—shape and crystallinity. The shape criterion is that of a column, i.e., continuous individual structures that are oriented roughly normal to the substrate. The columns are approximately normal to the substrate in that, for example, at least about 80% or at least about 90% of the structures have a central axis which is normal±20 degrees. Those structures have an average width, w, and height, h, where the shape criteria is h>w. Columnar morphology is typically characterized by superior electronic properties.

In other embodiments, the nanostructured film comprises nanoparticles and has a single crystal dendritic nanostructure. In some embodiments, the nanostructure has a columnar morphology. In other embodiments, the nanostructure has nanorod morphology.

The crystalline criterion can be based on grain size. Grain size is the characteristic dimension, or size, associated with a region of the same crystalline structure and orientation in space. Grain size can be measured by several methods known in the art, including x-ray diffraction (XRD) and transmission electron microscopy (TEM). In some embodiments, the nanostructure morphology is predominantly columnar where the nanoparticles have an average particle size of less than about 20 nanometers. The morphology is predominantly columnar when, for example, at least about 80% or at least about 90% of the deposited metal species-based nanoparticles constitute columns. Columnar morphology generally results when relatively small nanoparticles are deposited onto a high temperature, substrate wherein the nanoparticles are restructured by sintering to form columns.

Granular morphology generally comprises metal species-based nanoparticles caked onto a substrate. Granular morphology generally results when relatively large nanoparticles are deposited onto a relatively low temperature substrate to form fractal structures that undergo minimal restructuring after deposition. The average particle size range can be from about 10 nanometers to about 100 nanometers. In general, the grain size is less than about three times the size of the metal species-based nanoparticles before deposition. Granular films are characterized by a high surface area and superior reactive properties.

In some embodiments of the present disclosure, when TTIP is used as the precursor in the CVAD process, $TiO_2$ films can be obtained with dense, columnar and granular morphologies. These thin films can then be deposited on ITO coated glass, flexible glass and stainless steel substrates. The thin films fabricated on stainless steel substrates can be used as anodes for lithium ion batteries.

In other embodiments, when ATSB and TTIP are used as co-fed precursors, aluminum titanate films can be obtained with columnar morphology. In other embodiments, a single-step CVAD synthesis is used to create a single crystal columnar thin film of lithium titanate, which is formed directly on the current collector.

In other embodiments, when niobium ethoxide and TTIP are used as co-fed precursors, niobium doped titanium dioxide nanostructures can be obtained with columnar morphology.

In some embodiments, the metal precursor feed rate affects nanoparticle film morphology through the relationship to formed nanoparticle size. For a given substrate temperature, sintering dynamics are influenced by the size of the nanoparticles as they arrive at the substrate. Small nanoparticles tend to sinter at a faster rate than do larger nanoparticles. High metal precursor feed rates produce large metal species-based nanoparticles and low metal precursor feed rates produce small metal species-based nanoparticles. Large nanoparticles favor the formation of granular type films whereas small nanoparticles favor the formation of columnar type films. However, given sufficient sintering time, even large nanoparticles can form columnar films. In some embodiments, two or more metal species-based nanoparticles combine to form an aggregate before deposition onto the substrate.

Once the nanoparticles (and any remaining precursor) are deposited onto the temperature controlled substrate, the nanoparticles are sintered to form the metal species-based nanostructured film. Sintering generally results in two small particles combining to form a larger structure with a volume approximately equal to the sum of the two initial volumes. For slow sintering dynamics, films predominantly having granular morphology are typically formed. Alternatively, for rapid sintering dynamics, films predominantly having columnar morphology are typically formed. Sintering is a surface tension driven solid state diffusion process, and is generally a function of both initial particle diameter and temperature.

Without being bound to any particular theory, it is believed that the characteristic time for two particles of the same initial diameter to completely sinter into an equivalent-volume sphere, scales with initial diameter to the fourth power and exponentially decreases with increasing temperature. Thus, for smaller particles and higher temperatures, sintering is rapid; and for larger particles and lower temperatures, sintering is slow. Therefore, arrival size of particles at the substrate and the substrate temperature are two parameters that can be varied to influence the film morphology. Particle size, in turn, is a function of various process parameters and the interaction of those process parameters. Process parameters include the precursor temperature, the carrier gas temperature, the carrier gas flow rate, the dilution gas flow rate, the dilution gas temperature, the residence time of the nanoparticles in the reactor, and, the temperature of the substrate.

The nanostructured thin films of the present disclosure can be widely used in various applications, such as, but not limited to, magnetic information media, diodes, anti-microbial materials, gas sensors, solar energy applications, sodium ion batteries, and lithium ion batteries. In one aspect of the present disclosure, a CVAD process for the production of a lithium ion battery electrode is disclosed. The process comprises introducing at least one vaporized metal precursor into a reaction chamber; decomposing, at least in part, the at least one vaporized precursor to form metal species-based nanoparticles; directly depositing the nanoparticles and any remaining vaporized precursor onto a temperature controlled substrate to form the electrode; and, sintering the nanoparticles to form the metal species-based nanostructured electrode.

In some embodiments, the at least one precursor used to form the electrode comprises titanium tetraisopropoxide and 2,2,6,6-tetramethyl-3,5-heptanedionato lithium. In some embodiments, the metal species-based nanoparticles used to form the electrode comprise a metal oxide selected from the group consisting of lithium titanate, titanium dioxide and combinations thereof. It should be understood, however, that the precursors and metal species-based nanoparticles discussed elsewhere throughout this disclosure may also be used in the process of making the electrode.

The processes of the present disclosure provide numerous benefits and improvements over processes currently known in the art. For example, the CVAD process is a single-step process that is scalable, and can be extended as a roll-to-roll manufacturing process. Furthermore, a vacuum chamber is not required to carry out the processes because the processes are carried out at ambient pressure. Moreover, the CVAD processes can synthesize a variety of different metal oxide films by changing the precursors. Additionally, the CVAD process can be used to fabricate high quality lithium ion battery electrodes in a single-step without the need for any binding agent. Also, the nanostructured films may be formed directly on the current collector.

In some embodiments of the present disclosure, a CVAD process for the production of a sodium ion battery is disclosed. The CVAD process includes synthesizing doped titanium dioxide nanostructures that can be used, for example, as anodes in sodium ion batteries. In certain embodiments, niobium ethoxide is used as a precursor for niobium and TTIP is used as a precursor for titanium. In certain embodiments, both the niobium ethoxide precursor and the TTIP precursor are co-fed into the reaction chamber and react to form niobium doped titanium dioxide nanostructures. The niobium doping concentration may be present in an amount of from about 0.1% to about 10% by weight of the nanostructure. In some embodiments, the doping concentration is controlled by controlling the precursor temperatures and the carrier gas flow rate through the carrier tubes.

In some embodiments, the niobium doped titanium dioxide nanostructures have a columnar morphology, and thus the nanostructured film (and/or electrode) comprises niobium doped titanium dioxide nanoparticles. The niobium doped titanium dioxide nanostructures provide beneficial results and applications for example, for both lithium ion battery anodes and sodium ion battery anodes, and, further, are useful as transparent conducting oxide electrodes.

In some embodiments of the present disclosure, the nanostructured film is formed of nanorods and/or nanowires. In some embodiments, the nanorods and/or nanowires have a single crystal structure. In some embodiments, the nanorods and/or nanowires comprise tin oxide nanoparticles. In some embodiments, the tin oxide nanoparticles are produced from tetramethyl tin as a precursor.

The tin oxide nanorods and/or nanowires possess excellent electrochemical performance for use as, for example, anodes in lithium ion batteries. In some embodiments, the tin oxide nanoparticles have a predominantly nanorod morphology. In some embodiments, the tin oxide nanorods have a specific capacity of from about 700 mAhg$^{-1}$ to about 1000 mAhg$^{-1}$, from about 80% mAhg$^{-1}$ to about 90% mAhg$^{-1}$, or from about 825 mAhg$^{-1}$ to about 925 mAhg$^{-1}$.

Figure 6:
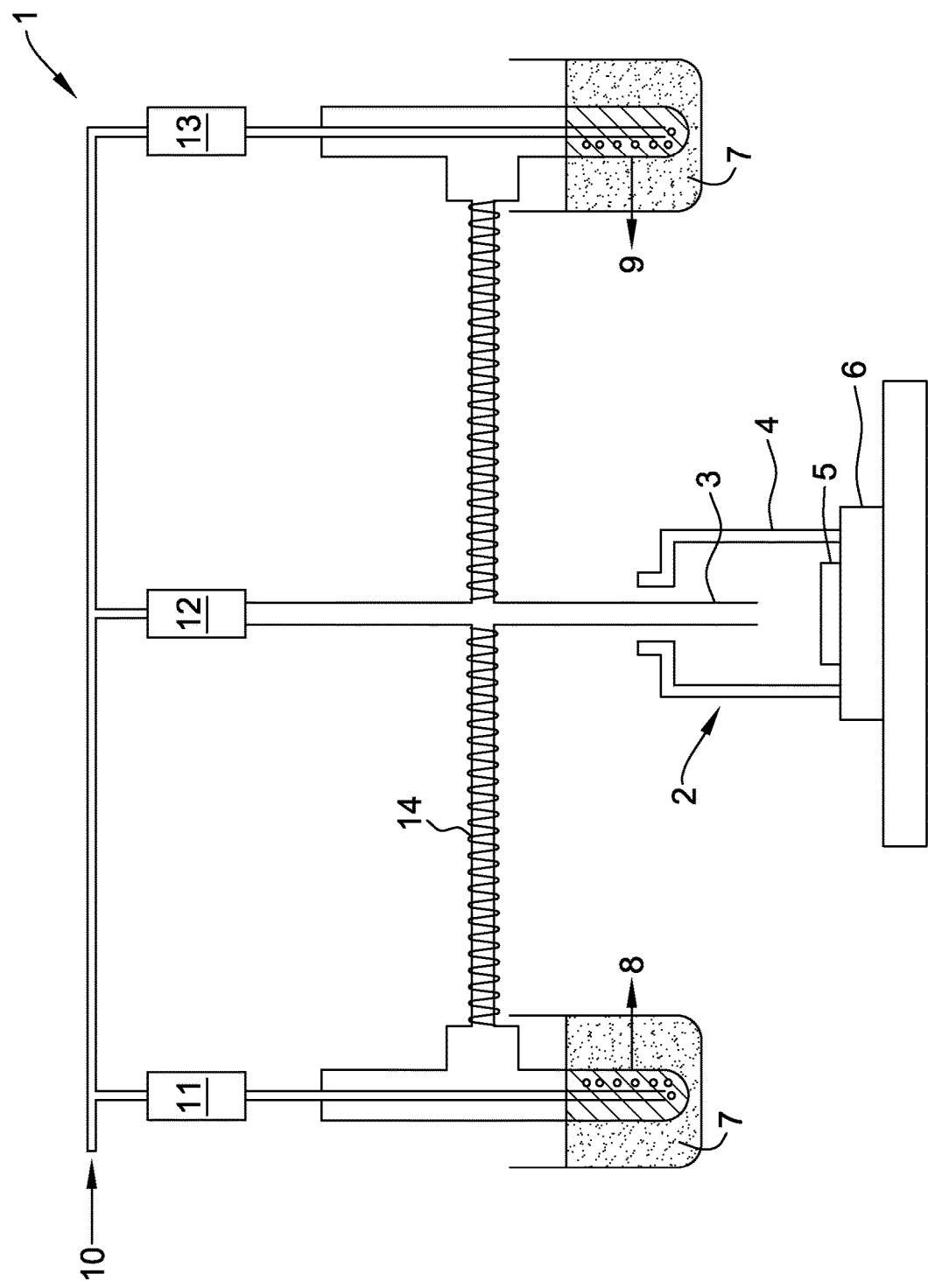
FIG. 6 is an exemplary embodiment of a schematic CVAD process in accordance with the present disclosure.

FIG. 6 discloses an exemplary CVAD process 1 in accordance with the present disclosure. The process 1 includes a reaction chamber 2, which can include an outer casing 4, a temperature controlled substrate 5 and a heated plate 6. A gas can enter through a gas entry port 10 and can be channeled down through at least one of three carrier tubes 11, 12, 13 to eventually enter the reaction chamber 2 via a feeder tube 3. The carrier tubes 11, 12, 13 can carry either a gas, a precursor or a combination thereof into the reaction chamber 2, accessing the chamber 2 eventually through feeder tube 3. After entry into the carrier tube(s) 11, 13, the at least one precursor 8, 9 enters into a heated oil bath 7 where the precursors 8, 9 are vaporized. The vapors of the precursor(s) 8, 9 then travel into the reaction chamber 2 through the feeder tube 3 while passing through a heating rope 14. The vapors can decompose in the reaction chamber 2 to form the metal species-based nanoparticles. The nanoparticles then form the nanostructured film when they are deposited onto the substrate 5 and sintered via the heated plate 6.

FIG. 6 illustrates an exemplary embodiment of the CVAD process of the present disclosure. CVAD can be a single-step ambient pressure process for the fabrication of nanostructured thin films of metal-based species. In some embodiments, the process comprises delivery of one or more vaporized precursors 8, 9 into a heated reaction chamber 2 where the precursors 8, 9 decompose to form nanoparticles of the desired composition in the gas phase. These nanoparticles can be deposited onto a temperature controlled substrate 5 where the nanoparticles sinter to form the desired nanostructure. In some embodiments, the nanostructure can be controlled by controlling the size of the depositing nanoparticles, the arrival rate of the nanoparticles and by the sintering rate of the nanoparticles on the substrate 5.

EXAMPLES

The following Example describes or illustrates various embodiments of the present disclosure. Other embodiments within the scope of the appended claims will be apparent to a skilled artisan considering the specification or practice of the disclosure as described herein. It is intended that the specification, together with the Example, be considered exemplary only, with the scope and spirit of the disclosure being indicated by the claims, which follow the Example.

Example 1

General Methods

In this example, highly oriented, single crystal dendritic TiO$_2$ nanocolumns were fabricated using a single-step CVAD process on stainless steel current collectors for use as high rate lithium ion battery anodes. The synthesized nanostructures exhibited an improved and unexpectedly high specific capacity for anatase TiO$_2$ without the use of any conductive additive or binding agent(s). The nanostructures also led to improved cycling performance and rate capability, which make the nanostructures ideal electrodes for high rate applications with no change in the nanostructure morphology even after 100 cycles. At a current density of about 16.75 A·g$^{-1}$ (50 C), the specific charge capacity of the columnar nanostructures was about 278% higher than that of the granular nanostructures synthesized by the same technique. This facile, low-cost synthesis of high performance anodes thus provides a single-step scalable alternative to the conventional fabrication of anode materials.

In this example, TiO$_2$ nanostructures have been grown directly on the current collector making it a single-step process for the fabrication of battery anodes without the use of any binding agents. This overcomes the limitations of the oriented attachment of the nanostructures to the current collector, decreases the contact resistance at the metal-semiconductor interface, and makes these nanostructures exceptionally stable to Li$^+$ intercalation and de-intercalation during cycling. Additionally, the synthesized nanostructures are one-dimensional single crystal anatase structures and thus have excellent electrical conductivity due to the absence of grain boundaries. This obviates the need of adding any conductive additive to the electrode. Furthermore, the nanostructures are highly oriented nanostructures with crystal plane orientations engineered to provide a directed Li$^+$ diffusion into and out of the structure. Further, the nanostructures created have a dendritic form with an exceptionally high surface area, which leads to a high electrode/electrolyte interfacial area.

In accordance with the present example, these unique TiO$_2$ nanostructures were synthesized using the CVAD process. The process involved the formation of metal oxide monomers, by thermal decomposition of an organometallic precursor at high temperatures, which then nucleate and grow to form particles. These particles deposit onto a substrate where they sinter to form thin films. By controlling the arrival particle size and the sintering rate of the particles, the morphology of the thin film can be controlled. Since the process is facile, continuous and scalable, the cost of fabrication of the anodes is extremely low.

Processes 1-dimensional (1-D) TiO$_2$ nanostructured thin films (columnar TiO$_2$) with a column height of about 800-1000 nanometers were synthesized on stainless steel current collector foils using the CVAD process in accordance with the present disclosure. The columns were tapered at both edges with a diameter of from about 150-200 nanometers in the thickest region. A strong diffraction peak in the X-ray diffraction (XRD) spectra for the columnar TiO$_2$ structures with a Lotgering factor of 1.0 indicated single crystal structures perfectly oriented along the anatase direction (peak [112]) (see, FIG. 2A).

Figure 2A:
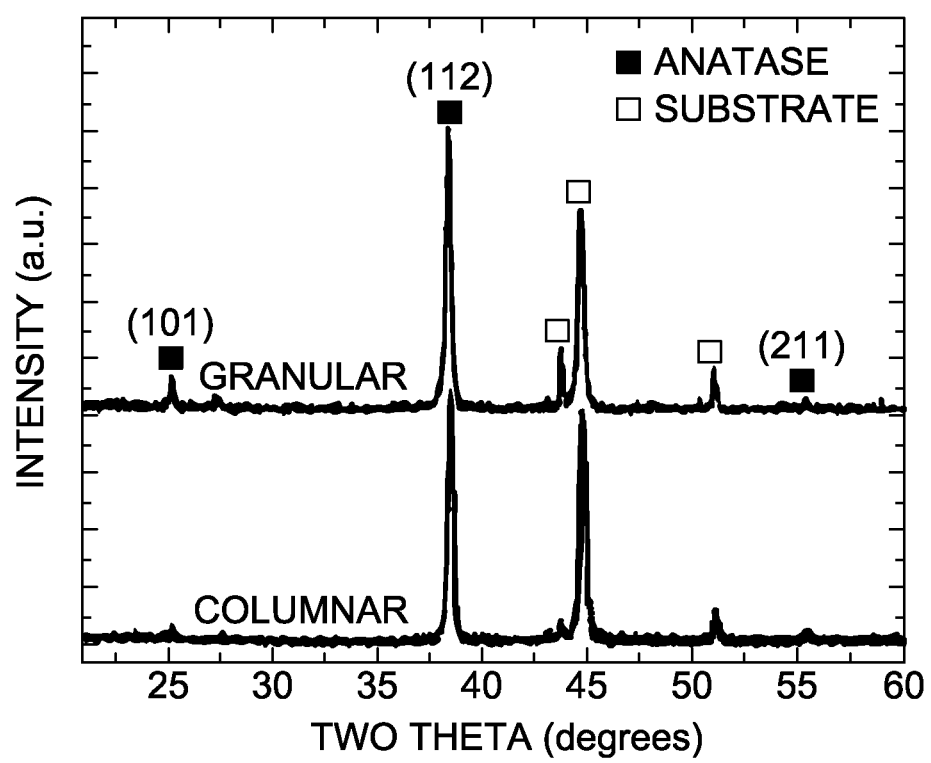
FIG. 2A is an exemplary embodiment of an x-ray diffraction (XRD) spectra of different nanostructures synthesized by the CVAD process in accordance with the present disclosure.
Figure 2B:
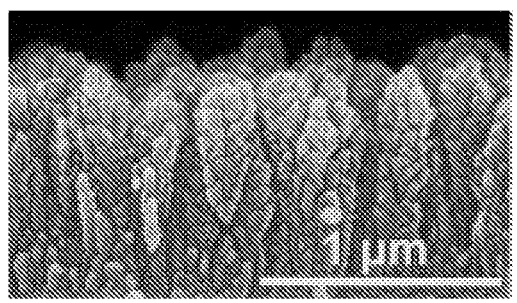
FIG. 2B is an exemplary embodiment of granular nanostructures synthesized by the CVAD process in accordance with the present disclosure.
Figure 2C:
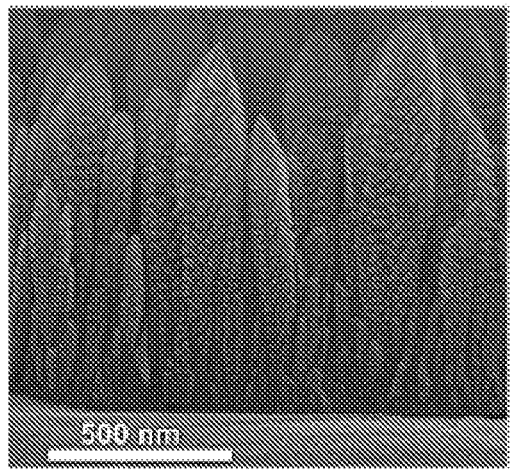
FIG. 2C is an exemplary embodiment of columnar nanostructures synthesized by the CVAD process in accordance with the present disclosure.
Figure 2D:
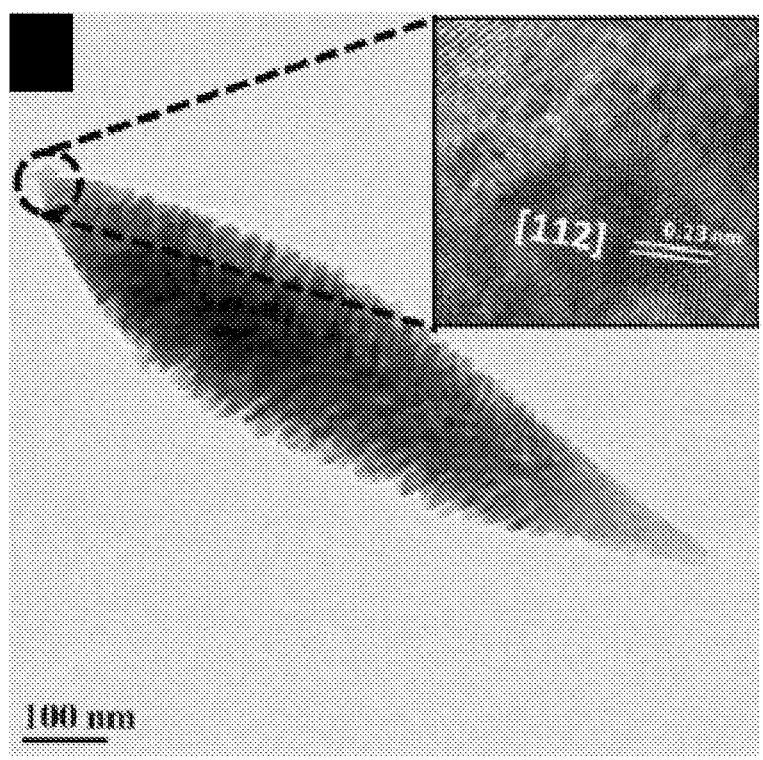
FIG. 2D is an exemplary embodiment of an HR-TEM image of a columnar structure synthesized by the CVAD process in accordance with the present disclosure.
Figure 2E:
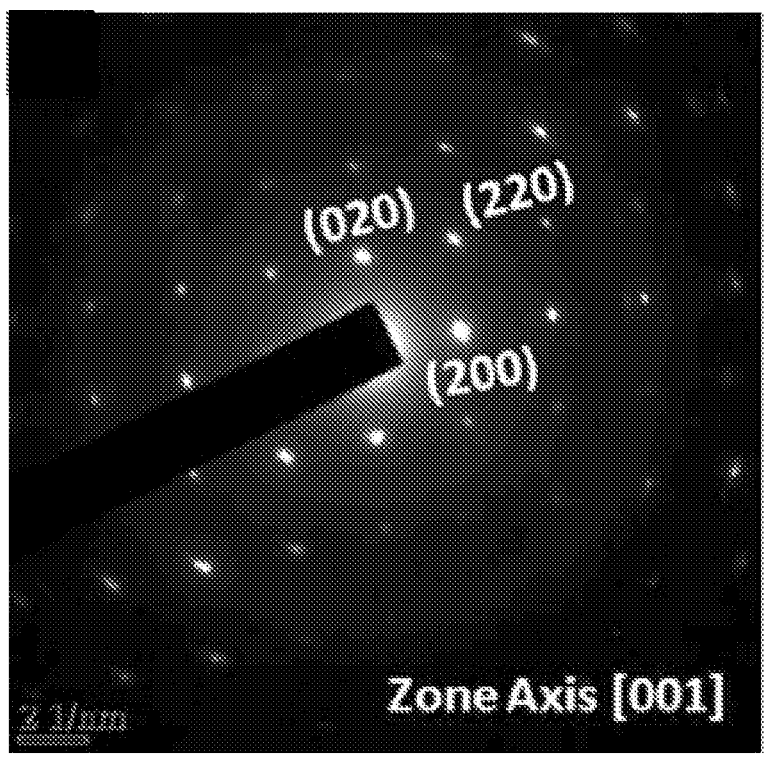
FIG. 2E is an exemplary embodiment of an SAED pattern at the tip of a columnar structure synthesized by the CVAD process in accordance with the present disclosure.

High resolution transmission electron microscopy (HR-TEM) (FIG. 2C) of a single 800 nanometer tall column with a maximum column width of about 200 nanometers and a tip width of about 30 nanometers further showed the dendritic structure and confirmed a d-spacing of about 0.23 nanometers on the tip surface corresponding to a preferential growth in the peak [112] direction of the anatase $TiO_2$ nanostructure (see FIG. 2D, showing the HR-TEM image of the columnar structure with an inset showing the crystal lattice at the tip of the column). The selected area diffraction (SAED) (FIG. 2E) at the tip of the column showed line patterning in a diffraction spot which clearly indicated the highly ordered and crystalline phase of the $TiO_2$ nanostructure. The SAED spots near the central spot correspond to the (020) plane and the (200) planes which are at an angle of 90° and the zonal axis of the SAED pattern is along the [001] direction (FIG. 2E).

To investigate the advantages of the single crystal dendrites and preferred orientation, granular $TiO_2$ nanostructures with a similar height were synthesized by the same process with a change in operating conditions. These granular structures had a higher presence of (101) anatase crystal plane leading to a Lotgering factor of 0.89.

Figure 3A:
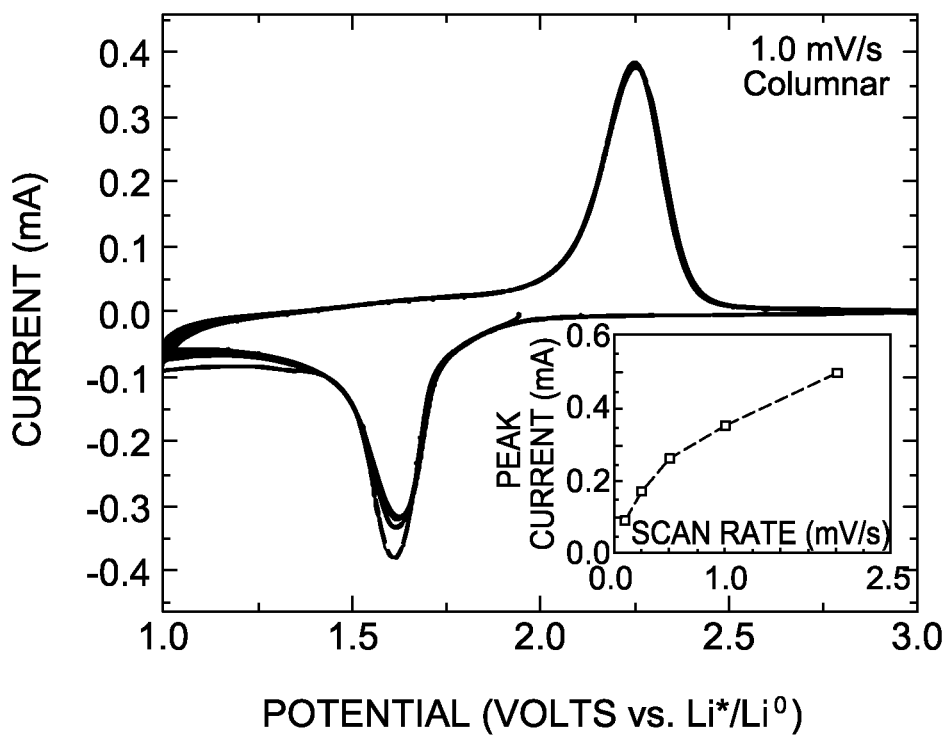
FIG. 3A is an exemplary embodiment of a cyclic voltammogram of a columnar nanostructure in accordance with the present disclosure. The voltammogram is for five cycles at a scan rate of 1 mV/sec.

In order to validate the structural merits of the nanostructures, the electrochemical characterization was carried out in a half-cell configuration with the nanostructured $TiO_2$ thin film as the anode. All tests were performed in a potential range of from about 1.0 V to 3.0 V at a constant temperature of about 22° C. The redox couple of the intercalation and de-intercalation of Li+ in the TiO2 crystal lattice by performing cyclic voltammetry of the cell were first investigated (FIG. 3A).

At a scan rate of about 1.0 mV/s, distinct, sharp, single anodic and cathodic current peaks were observed at about 1.65 V and about 2.22 V for columnar $TiO_2$, indicating the presence of phase pure anatase $TiO_2$. The peak current scaled with the square root of the scan rate, as expected for diffusion controlled irreversible kinetics. Similar peaks were observed for the granular structure at about 1.62 V and about 2.23 V. No peak shift was observed after the first cycle in both the nanostructures indicating excellent reversibility of the lithium intercalation/de-intercalation reactions. The reversible charge transfer was about 97.16% and about 92.5% for the columnar and granular structures, respectively, substantiating the superior activity of the columnar structure over the granular structure for charge storage.

Figure 3B:
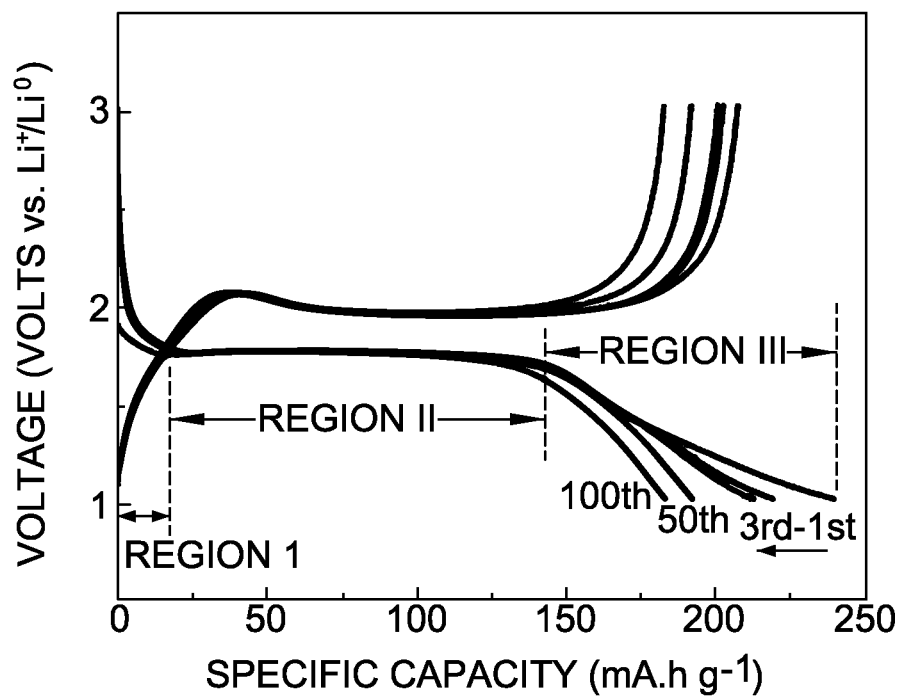
FIG. 3B is an exemplary embodiment of a galvanostatic charge-discharge voltage profile of a columnar nanostructure in accordance with the present disclosure at a 1 C rate (335 mA $g^{-1}$).
Figure 3C:
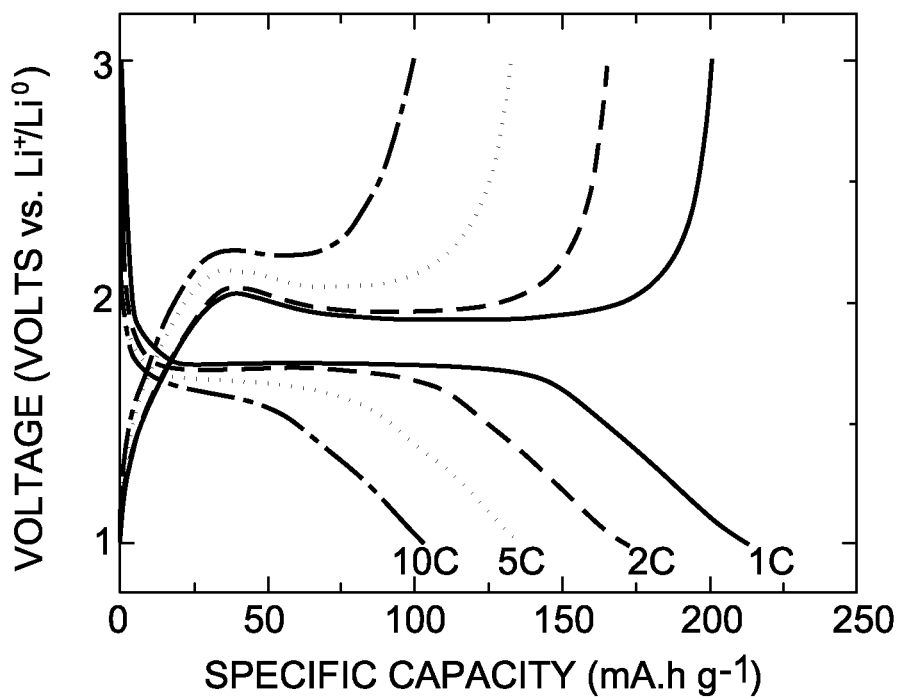
FIG. 3C is an exemplary embodiment of a galvanostatic charge-discharge voltage profile of columnar nanostructures in accordance with the present disclosure at varying rates from 1 C-10 C.
Figure 3D:
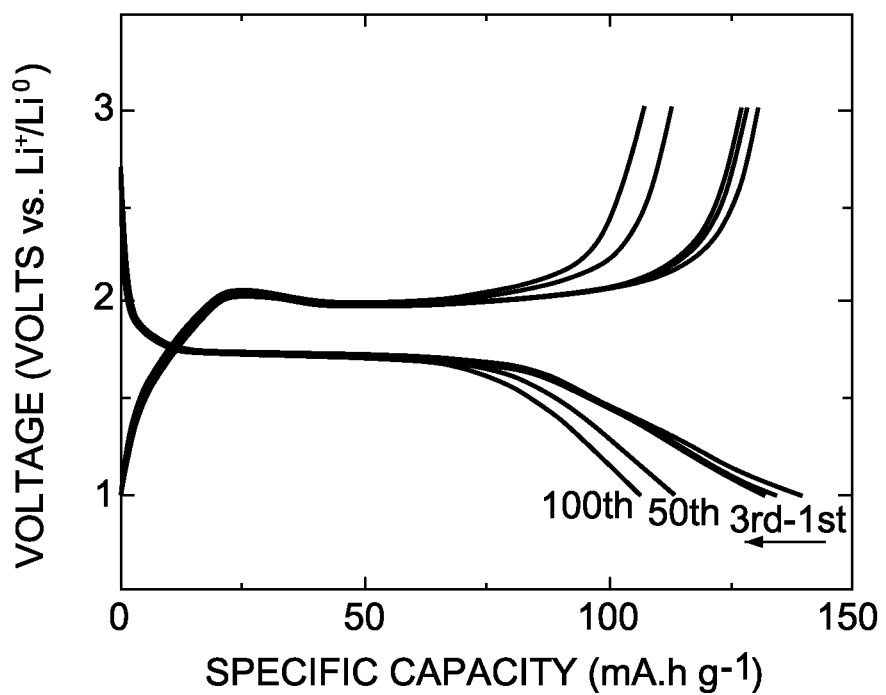
FIG. 3D is an exemplary embodiment of a galvanostatic charge-discharge voltage profile of a granular nanostructure in accordance with the present disclosure at a 1 C rate.

The galvanostatic charge discharge measurement performed for the columnar $TiO_2$ nanostructures (FIG. 3B) at a current density of about 1 C (=335 mA g$^{-1}$) depicted an initial discharge capacity of about 240.06 mA·h g$^{-1}$, about 83.76% higher (130.64 mA·h g$^{-1}$ for granular TiO2) than that of the granular $TiO_2$ nanostructure (FIG. 3D). The initial charge capacity of the columnar $TiO_2$ nanostructure was about 207.80 mA·h g$^{-1}$ yielding a columbic efficiency of about 86.56%. Subsequent columbic efficiencies were about 92.40% and about 95.03% for the second and the third cycle, respectively. The increasing columbic efficiency with the increasing cycles indicated a decreased loss of Li$^+$ ion in the crystal lattice of the anatase structure due to various secondary irreversible reactions.

Upon analysis of galvanostatic cycling at higher current densities up to 10 C (FIG. 3C), certain characteristic attributes were observed. First, the electrode showed reversible behavior in the entire current density range with high columbic efficiencies (>95%) and second, in all cases two distinct plateaus at about 1.6-1.8 V and at about 1.9-2.2 V were observed, coherent with the anodic and cathodic current peak positions in the cyclic voltammetry study. The discharge (anodic) plateau (denoted as region II in FIG. 3B) is representative of the Li$^+$ insertion into the octahedral sites of anatase $TiO_2$, leading to a biphasic formation of the Li-poor ($Li_{0.05}TiO_2$) and the Li-rich ($Li_xTiO_2$; x≤0.5) phase.

The capacity contribution from the following decline in voltage from about 1.7 V to about 1.0 V (region III) corresponds to the surface storage of Li$^+$ ions after all the interstitial octahedral sites inside the crystal lattice were filled, which is a purely capacitive behavior known for $TiO_2$ (FIG. 3B).

Region II was the highest contributor to the loss of capacity with increasing current density evident of sluggish diffusion at higher current densities complimenting the earlier finding from cyclic voltammetry that the lithium intercalation kinetics is diffusion limited (FIG. 3B). Interestingly, the same region was accountable for the decreased capacity of the granular structures compared to the columnar structures of similar height and at a fixed current density, the potential difference between the two plateaus was lower for the columnar nanostructures than the granular nanostructures—signifying lower charge transfer resistance in the columnar structures.

As mentioned earlier, the granular structure had a higher orientation along the (101) plane in comparison to the columnar structures which are perfectly oriented along the (112) plane (FIG. 2A). The surface energy of the (112) plane has been calculated to be about equal to 0.97 J m$^{-2}$, which was much higher than that of the (101) plane (≈0.65 J m$^{-2}$), making them more suitable for lithium intercalation (FIG. 2A). This validated the hypothesis that the columnar $TiO_2$ nanostructures have a higher mobility of Li$^+$ ions and better electronic conductivity than the granular structure due to their unique oriented single crystal dendrite structure.

Figure 4A:
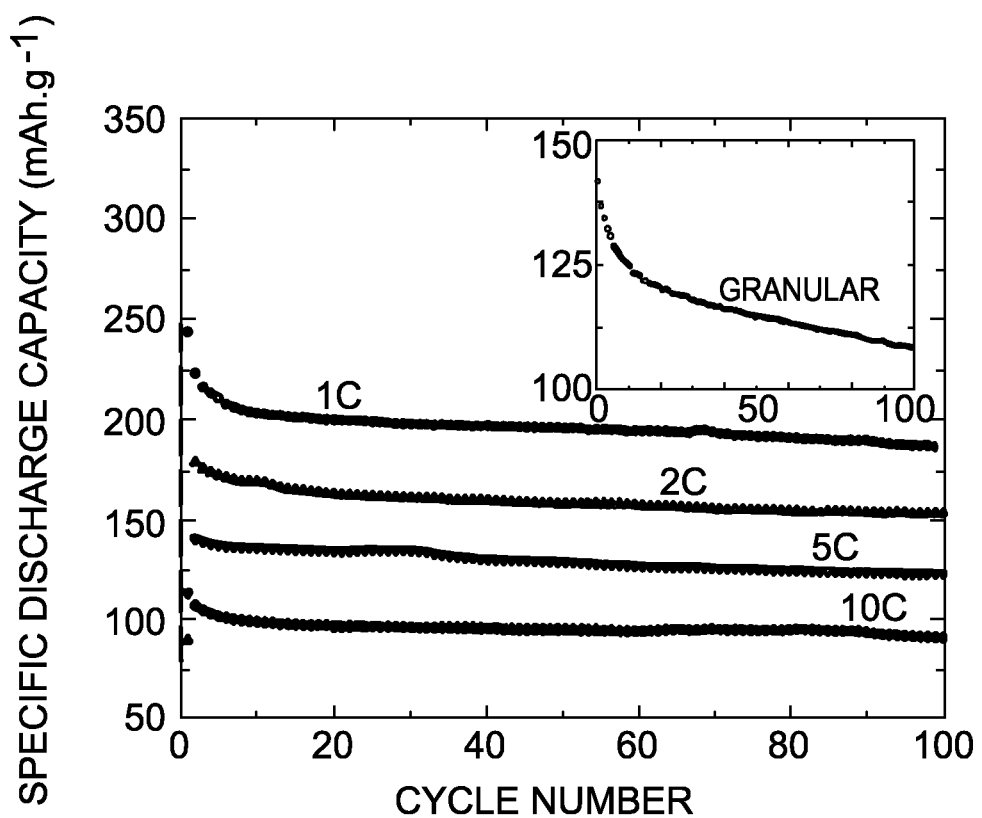
FIG. 4A is an exemplary embodiment of the cycle performance of columnar nanostructures in accordance with the present disclosure at varying current densities from 1 C-10 C for 100 cycles.

Remarkable cycling performance was observed for the columnar $TiO_2$ nanostructures with about 86.24% (183.49 mA·h g$^{-1}$) capacity retention (against 3rd cycle discharge capacity) after 100 cycles at about 1 C current density (FIG. 4A). In comparison, the granular structures demonstrated only about 79.28% capacity retention under the same conditions. Even at higher current densities, the columnar nanostructures exhibit excellent capacity retention of about 87.28% (150.79 mA·h g$^{-1}$), 88.59% (121.18 mA·h g$^{-1}$), and about 86.80% (89.56 mA·h g$^{-1}$) for 2 C, 5 C and 10 C charge densities respectively after 100 cycles. This established the incredible structural stability of the columnar $TiO_2$ nanostructures to lithium intercalation/de-intercalation which was further confirmed by ex-situ TEM analysis of the cycled anode (100 cycles at 1 C rate) (FIG. 4C). Except for the formation of an about 10 nanometer thick amorphous layer, no structural change was observed in the columns or its dendritic branches. The amorphous layer is attributed to the formation of a solid electrolyte interface (SEI) layer which was confirmed by the presence of extra peaks for phosphorus and fluorine in the EDAX analysis of the cycled electrode.

Figure 5:
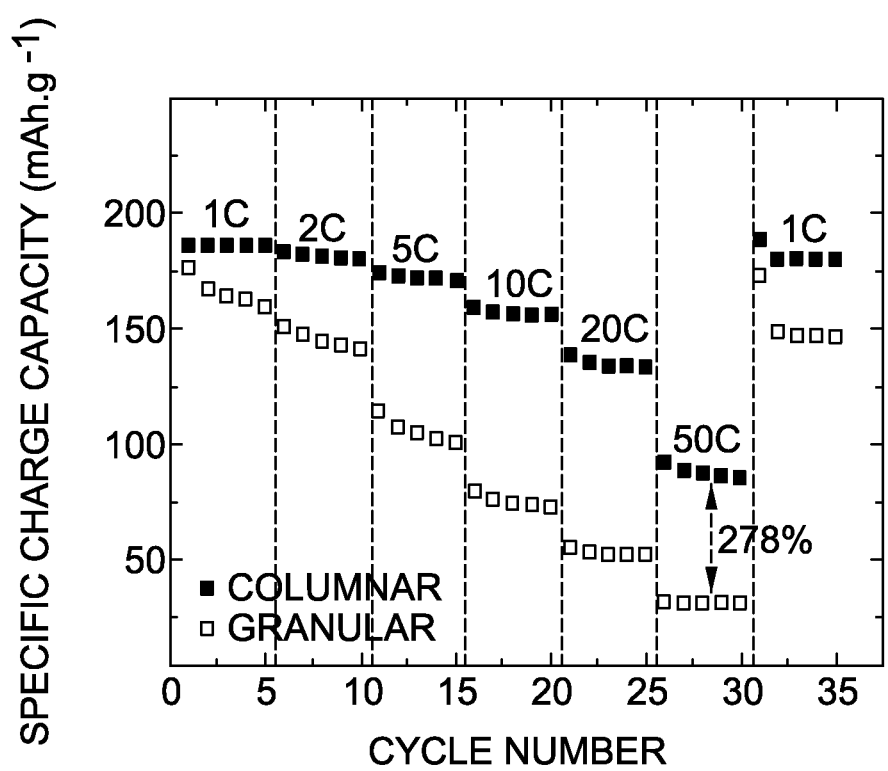
FIG. 5 is an exemplary embodiment of the rate capability of the columnar and granular nanostructures in accordance with the present disclosure with the charge rate varying from 1 C to 50 C with a constant 1 C discharge rate.

Rate capability analysis of the nanostructures highlighted the superiority of the columnar structures over the granular structures (FIG. 5). The specific charge capacity ratio between the columnar and the granular structure widened with increasing charging rates (about 115% at 1 C to about 278% at 50 C) making the granular structure more susceptible to higher rates due to the absence of conductive carbon additives. For the columnar structures, a charge capacity retention of about 72.04% and about 46.26% even at charging rates as high as 20 C (=6.70 A g$^{-1}$) and 50 C (=16.75 A g$^{-1}$), respectively, avoided the need for any conductive additives. About 96.5% (91.70% for the granular structure) capacity is retained upon reducing the charging rate back to 1 C after 30 cycles.

This example demonstrated that the use of single crystal, highly oriented dendritic $TiO_2$ nanostructures can lead to excellent electrochemical performance without the use of any binding agent or conductive additive. These exemplary columnar nanostructures were able to achieve an improved, higher specific capacity and remarkable cycling behavior even at current densities as high as 10 C (3.35 A g$^{-1}$). The nanostructures exhibited excellent rate capabilities, which in conjunction with the safety associated with phase pure anatase TiO$_2$, makes them suitable for high rate applications in electric vehicles and hybrid electric vehicles. This exceptional performance is attributed to four key factors: (1) the single crystal nature provides higher electronic conductivity; (2) perfect orientation along the high surface energy (112) plane, which provides higher mobility of Li$^+$ ions through the structure; (3) the direct fabrication of the 1-D nanostructure on the current collector provides enhanced structural stability; and, (4) the dendritic structure provides a high surface area at the electrode-electrolyte interface. Furthermore, the facile single-step synthesis route makes the fabrication of these nanostructured anodes highly scalable and low-cost. A similar single-step approach can also be further extended to other materials associated with lithium ion batteries thereby enhancing their performance.

Example 2

In Example 2, the performance of columnar TiO$_2$ nanostructures as anodes in sodium ion batteries was studied. In this example, the CVAD processes in accordance with the present disclosure were used to synthesize doped titanium dioxide nanostructures. More specifically, niobium doped nanostructures were synthesized using the CVAD process of the present disclosure.

Niobium ethoxide was used as the precursor for niobium and TTIP was used as the precursor for titanium. Both precursors were fed into the reaction chamber where the precursors reacted to form niobium doped titanium dioxide nanostructures. The doping concentration of the niobium was controlled between about 0.1% to about 10% by controlling the precursor temperatures and the carrier gas flow rate through the carrier tubes.

Figure 8:
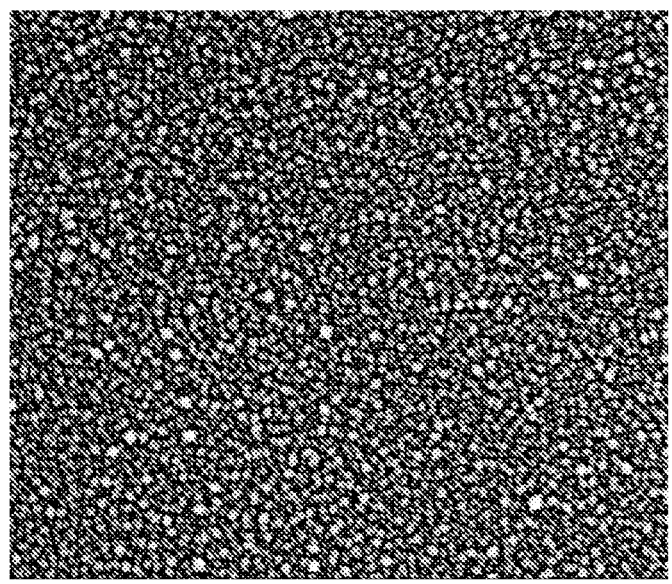
FIG. 8 is an exemplary embodiment of an SEM top view of niobium doped $TiO_2$ nanostructures in accordance with the present disclosure.
Figure 9:
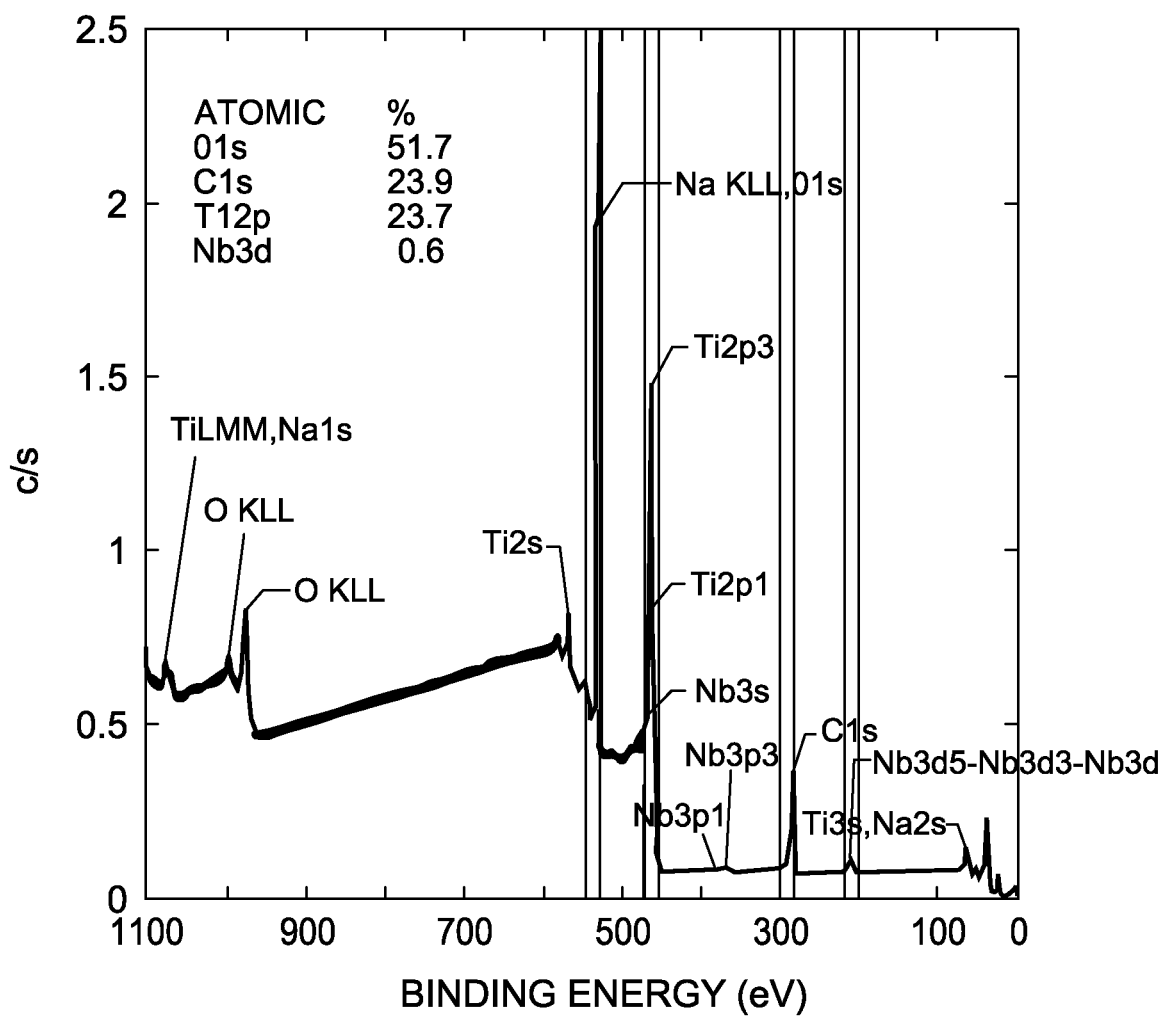
FIG. 9 is an exemplary embodiment of an XPS analysis of niobium doped $TiO_2$ thin film nanostructures in accordance with the present disclosure.

FIG. 8 provides a top view of the thin film columnar morphology and confirms the niobium doping of the titanium dioxide nanostructures. This was also confirmed by the data shown in FIG. 9, which shows the x-ray photoelectron spectroscopy analysis of niobium doped titanium dioxide thin films. FIG. 9 depicts a niobium doping percentage of about 2.5% by weight of the nanostructures.

Figure 7:
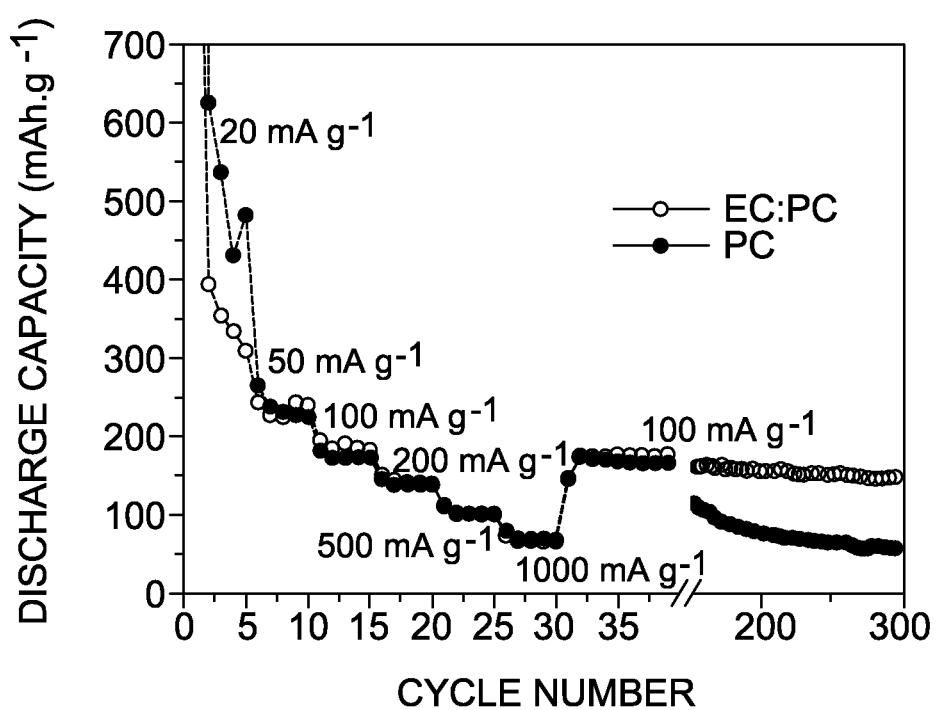
FIG. 7 is an exemplary embodiment of the rate capacity performance of columnar $TiO_2$ nanostructures as anodes for sodium ion batteries in different electrolytes in accordance with the present disclosure.

As can be seen in FIG. 7, the niobium doped titanium dioxide nanostructures have tremendous application as both lithium ion battery anodes and sodium ion battery anodes, as well as for transparent conducting oxide electrodes. Specifically, as shown in FIG. 7, the rate capacity performance of columnar TiO$_2$ nanostructures as anodes for sodium ion batteries in different electrolytes showed that the nanostructures exhibit good stability with complete capacity retention even after cycling at higher rates of charge/discharge.

Example 3

In this example, tin oxide nanorods were synthesized using the CVAD process in accordance with the present disclosure. Tetramethyl tin (TMT) was used as the precursor for producing the tin nanoparticles. Tin oxide nanoparticles in the form of nanorods were observed as a result of the CVAD process and included a single crystal structure. SAED patterns near the tip of the nanorods confirmed the single crystal nature of the nanostructures.

The tin oxide nanorods were deposited directly onto a stainless steel foil. The nanorods proved useful as anodes in lithium ion batteries. The specific capacity of the tin oxide nanorods went from about 925 mAhg$^{-1}$ to about 80% mAhg$^{-1}$ after about 20 cycles. Thus, the electrochemical performance of the tin oxide nanorods exhibited excellent performance with a specific capacity greater than about 80% mAhg$^{-1}$ and a good cyclability up to about 20 cycles (at a current density of about 50 mA/g).

EQUIVALENTS AND SCOPE

In view of the above, it will be seen that the several advantages of the disclosure are achieved and other advantageous results attained. As various changes could be made in the above processes and composites without departing from the scope of the disclosure, it is intended that all matter contained in the above description and shown in the accompanying drawings shall be interpreted as illustrative and not in a limiting sense.

When introducing elements of the present disclosure or the various versions, embodiment(s) or aspects thereof, the articles "a", "an", "the" and "said" are intended to mean that there are one or more of the elements. It is also noted that the terms "comprising", "including", "having" or "containing" are intended to be open and permits the inclusion of additional elements or steps.

What is claimed is:

1. A chemical vapor and aerosol deposition process for preparation of a metal species-based nanostructured film comprising niobium doped titanium dioxide nanoparticles, the process comprising:
   introducing at least one vaporized metal precursor into a reaction chamber, wherein the reaction chamber includes a temperature controlled metal substrate;
   decomposing, at least in part, the at least one vaporized precursor to form metal species-based nanoparticles in the reaction chamber;
   depositing the nanoparticles and any remaining vaporized precursor onto the temperature controlled metal substrate in the reaction chamber; and,
   sintering the nanoparticles to form the metal species-based nanostructured film in the reaction chamber, wherein the nanostructured film has a morphology selected from the group consisting of a predominantly columnar morphology, a predominantly granular morphology, a predominantly nanorod morphology, a predominantly nanowire morphology, and a predominantly branched morphology.

2. The process of claim 1, wherein the metal species-based nanoparticles further comprise a metal oxide selected from the group consisting of lithium titanate, aluminum titanate, tin oxide, lithium manganese oxide, lithium cobalt oxide, lithium manganese nickel cobalt oxide, nickel oxide, copper oxide, and combinations thereof.

3. The process of claim 1, wherein the nanostructure is of a predominantly columnar morphology.

4. The process of claim 3, wherein the columnar morphology has a crystalline order of from about 1 nanometer to about 5 micrometers.

5. The process of claim 1, wherein the at least one precursor is selected from the group consisting of titanium tetraisopropoxide (TTIP), niobium ethoxide, aluminum tri-secbutoxide (ATSB), tetramethyl tin (TMT), 2,2,6,6-tetramethyl-3,5-heptanedionato lithium [Li (TMHD)], lithium dipivaloylmethanate [Li(DPM)], lithium acetylacetonate and combinations thereof.

6. The process of claim 1, wherein the film has a thickness of from about 10 nanometers to about 1 millimeter.

7. The process of claim 1, wherein the nanoparticles have an average particle size of less than about 100 nanometers.

8. The process of claim 1, wherein the temperature controlled substrate is controlled to a temperature of from about 20° C. to about 1000° C.

9. The process of claim 1, wherein the nanostructured film comprises a niobium doping percentage in a range of from about 0.1% to about 10% by weight of the nanostructured film.

10. An anode for an ion battery comprising a metal species-based nanostructured film directly deposited onto a metal substrate, the film comprising nanoparticles and having a single crystal dendritic nanostructure morphology.

11. The anode of claim 10, wherein the metal species-based nanoparticles comprise a metal oxide selected from the group consisting of lithium titanate, aluminum titanate, titanium dioxide, tin oxide, lithium manganese oxide, lithium cobalt oxide, lithium manganese nickel cobalt oxide, nickel oxide, copper oxide, and combinations thereof.

12. The anode of claim 10, wherein the nanostructure morphology is a columnar morphology having a crystalline order of from about 1 nanometer to about 5 micrometers.

13. The anode of claim 10, wherein the nanostructure morphology is a nanorod morphology and comprises tin oxide nanoparticles.

14. The anode of claim 10, wherein the film comprises niobium doped titanium dioxide nanoparticles.

15. A chemical vapor and aerosol deposition process for production of an ion battery anode, the process comprising:
introducing at least one vaporized metal precursor into a reaction chamber, wherein the reaction chamber includes a temperature controlled metal substrate current collector;
decomposing, at least in part, the at least one vaporized precursor to form metal species-based nanoparticles in the reaction chamber;
directly depositing the nanoparticles and any remaining vaporized precursor onto the temperature controlled metal substrate current collector in the reaction chamber; and,
sintering the nanoparticles to form the metal species-based nanostructured anode in the reaction chamber, wherein the nanostructured anode has a morphology selected from the group consisting of a predominantly columnar morphology, a predominantly granular morphology, a predominantly nanorod morphology, a predominantly nanowire morphology, and a predominantly branched morphology.

16. The process of claim 15, wherein the at least one precursor is selected from the group consisting of titanium tetraisopropoxide, niobium ethoxide, 2,2,6,6-tetramethyl-3,5-heptanedionato lithium, tetramethyl tin and combinations thereof.

17. The process of claim 15, wherein the metal species-based nanoparticles comprise a metal oxide selected from the group consisting of lithium titanate, tin oxide, titanium dioxide and combinations thereof.

18. The process of claim 15, wherein the anode comprises niobium doped titanium dioxide nanoparticles.

19. The process of claim 15, wherein the anode is selected from the group consisting of a lithium ion battery anode and a sodium ion battery anode.

20. The process of claim 15, wherein the anode comprises tin oxide nanoparticles.

* * * * *